United States Patent
Turk et al.

(12) 
(10) Patent No.: US 6,574,773 B1
(45) Date of Patent: Jun. 3, 2003

(54) COST-EFFECTIVE HIGH-THROUGHPUT ENUMERATIVE ENDEC EMPLOYING A PLURALITY OF SEGMENTED COMPARE TABLES

(76) Inventors: Stephen A. Turk, 841 Bross St., Longmont, CO (US) 80501; Christopher P. Zook, 8901 Sage Valley Rd., Longmont, CO (US) 80503

(*) Notice: Subject to any disclaimer, the term of this patent is extended or adjusted under 35 U.S.C. 154(b) by 0 days.

(21) Appl. No.: 09/523,922

(22) Filed: Mar. 9, 2000

(51) Int. Cl.[7] .......................... H03M 7/46; H03M 13/00
(52) U.S. Cl. ........................................ 714/792; 341/59
(58) Field of Search ................................ 714/769, 792; 341/59

(56) References Cited

U.S. PATENT DOCUMENTS

| | | | |
|---|---|---|---|
| 3,689,899 A | * | 9/1972 | Franaszek ..................... 341/59 |
| 5,099,237 A | * | 3/1992 | Fitingof ........................ 341/106 |
| 5,760,718 A | * | 6/1998 | Schouhamer Immink .... 341/58 |
| 6,003,153 A | | 12/1999 | Shimoda ..................... 714/792 |
| 6,043,764 A | * | 3/2000 | Sannino et al. ................ 341/58 |
| 6,388,587 B1 | * | 5/2002 | Brickner et al. .............. 341/59 |

OTHER PUBLICATIONS

Patrovics et al., "Encoding of dklr–Sequences Using One Weight Set", IEEE Transactions of Information Theory, vol. 42, No. 5, Sep. 1996, pp. 1553–1554.*

M. Mansuripur, "Enumerative Modulation Coding with Arbitrary Constraints and Post–Modulation Error Correction Coding for Data Storage Systems", *SPIE*, vol. 1499, Optical Storage Data '91.

U.S. patent application Ser. No.: 09/451,392, "Selectively Removing Sequences From An Enumerative Modulation Code".

* cited by examiner

*Primary Examiner*—Stephen M. Baker (57) ABSTRACT

A cost-effective high-throughput enumerative encoder is disclosed for encoding m-bit input datawords in an input data stream into n-bit output codewords in an encoded output data stream for use in a communication channel. The enumerative encoder comprises an input buffer for storing a plurality of bits in the input data stream, and a plurality of segmented compare tables for encoding the bits stored in the input buffer into the encoded output data stream, wherein each segmented compare table represents a segment of a full compare table of an enumerative trellis. A cost-effective high-throughput enumerative decoder is also disclosed for decoding n-bit input codewords in a received data stream into m-bit output datawords in a decoded data stream for use in a communication channel. The enumerative decoder comprises an input buffer for storing a plurality of bits in the received data stream, and a plurality of segmented compare tables for decoding the bits stored in the input buffer into the decoded data stream, wherein each segmented compare table represents a segment of a full compare table of an enumerative trellis.

29 Claims, 9 Drawing Sheets

COST-EFFECTIVE HIGH-THROUGHPUT ENUMERATIVE ENDEC EMPLOYING A PLURALITY OF SEGMENTED COMPARE TABLES

CROSS REFERENCE TO RELATED APPLICATIONS AND PATENTS

This application is related to other co-pending U.S. patent applications, namely application Ser. No. 09/451,392 entitled "SELECTIVELY REMOVING SEQUENCES FROM AN ENUMERATIVE MODULATION CODE," and concurrently filed application Ser. No. 09/521,554 entitled "MULTIPLE-RATE CHANNEL ENDEC IN A COMMUTED READ/WRITE CHANNEL FOR DISK STORAGE SYSTEMS." The disclosures of the above-referenced patent applications are incorporated herein by reference.

FIELD OF INVENTION

The present invention relates to data transmission in communication systems, such as the recording and reproduction of binary data in disk storage systems for digital computers, particularly to a cost-effective, high-throughput enumerative encoder/decoder (ENDEC) for encoding/decoding a data stream using a plurality of segmented compare tables representing the full compare table of an enumerative trellis.

MICROFICHE APPENDIX

This application includes a microfiche appendix of 1 microfiche comprising 50 frames.

BACKGROUND OF THE INVENTION

Figure 1:
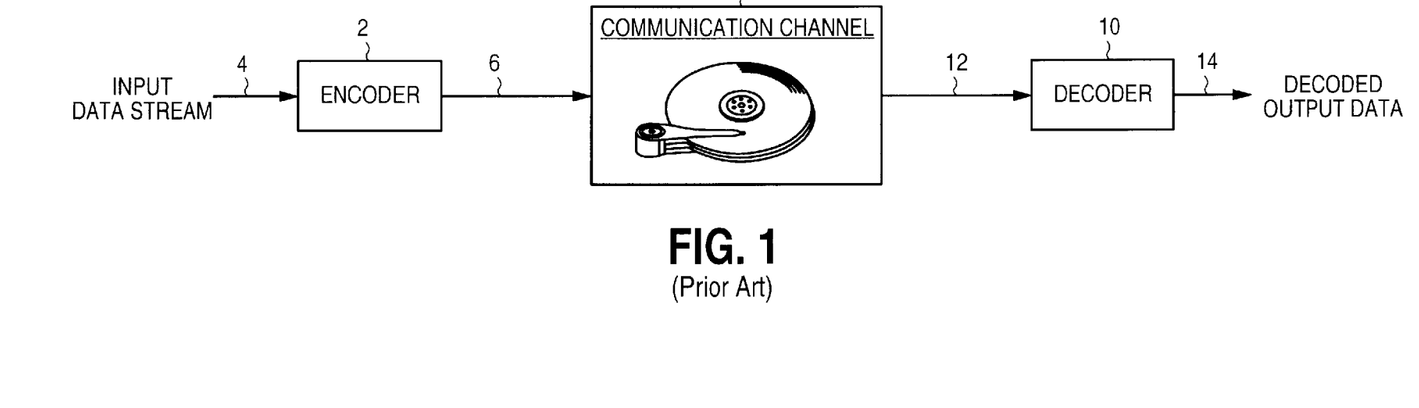
FIG. 1 is a block diagram of a communication system comprising an encoder for encoding an input data stream before transmission through a communication channel (e.g., a disk storage channel) and a decoder for decoding the received data stream into decoded output data.

Communication systems generally employ a channel code in order to increase the effective signal-to-noise ratio (SNR), thereby increasing the transmission speed while maintaining some arbitrarily low bit error rate. As illustrated in FIG. 1, an encoder 2 encodes an input data stream 4 into an encoded data stream 6 which is then transmitted through a communication channel 8 (e.g,. recorded to a disk). At the receiving end, a decoder 10 decodes the received data stream 12 into decoded output data 14, wherein noise in the communication channel 8 may induce errors in the decoded output data 14. Encoding the input data stream 4 before transmission decreases the bit error rate by increasing noise immunity (increasing the effective SNR). In magnetic disk storage systems, for example, a run-length limited (RLL) channel code is typically employed to limit the spacing between consecutive medium transitions as well as to constrain the maximum spacing between consecutive medium transitions (i.e., constrain the minimum and maximum number of "0" bits between "1" bits in NRZI recording). The first constraint (the "d" constraint) increases the effective SNR by attenuating intersymbol interference (ISI). The second constraint (the "k" constraint) increases the effective SNR by increasing the accuracy of the phase error estimate in the timing recovery phase-locked loop. Other constraints may also be implemented by the channel code; for example, a maximum transition run-length (MTR) limits the maximum number of consecutive medium transitions which increases the effective SNR by "coding out" certain dominant error events from a trellis sequence detector.

Encoding the input data stream to satisfy a given set of code constraints requires that a certain number of redundancy bits be added to the transmitted (recorded) data stream. The redundancy bits decrease the transmission rate (storage density) by increasing the total number of bits which must be transmitted for every uncoded bit. This is generally referred to as the "code rate" and is denoted by the ratio m/n where m represents the number of unencoded bits and n represents the number of encoded bits. Employing a channel code allows for an increase in the transmission rate (storage capacity) only if the code rate is sufficiently large; however, maximizing the code rate often means increasing the cost and complexity of the ENDEC circuitry. Thus, significant effort is spent on designing channel codes which exhibit a high code rate while minimizing the cost and complexity of the ENDEC circuitry.

One known method for implementing a channel ENDEC which provides relatively high code rates with nominal cost and complexity is a technique referred to as "enumerative coding". This technique is described in detail by M. Mansuripur in "Enumerative Modulation Coding with Arbitrary Constraints and Post-Modulation Error Correction Coding for Data Storage Systems," *SPIE*, vol. 1499, Optical Data Storage, 1991, pp. 72–86, the disclosure of which is incorporated herein by reference.

Enumerative codes are essentially block codes wherein an m-bit input block or dataword is encoded into an n-bit output block or codeword. The m-bit input block is viewed as an integer which is processed through an enumerative trellis. Each state in the enumerative trellis is assigned a value representing the number of unique paths through the enumerative trellis starting from that state. The enumerative trellis is derived from a state transition diagram which defines the channel code in terms of the code constraints.

Figure 2A:
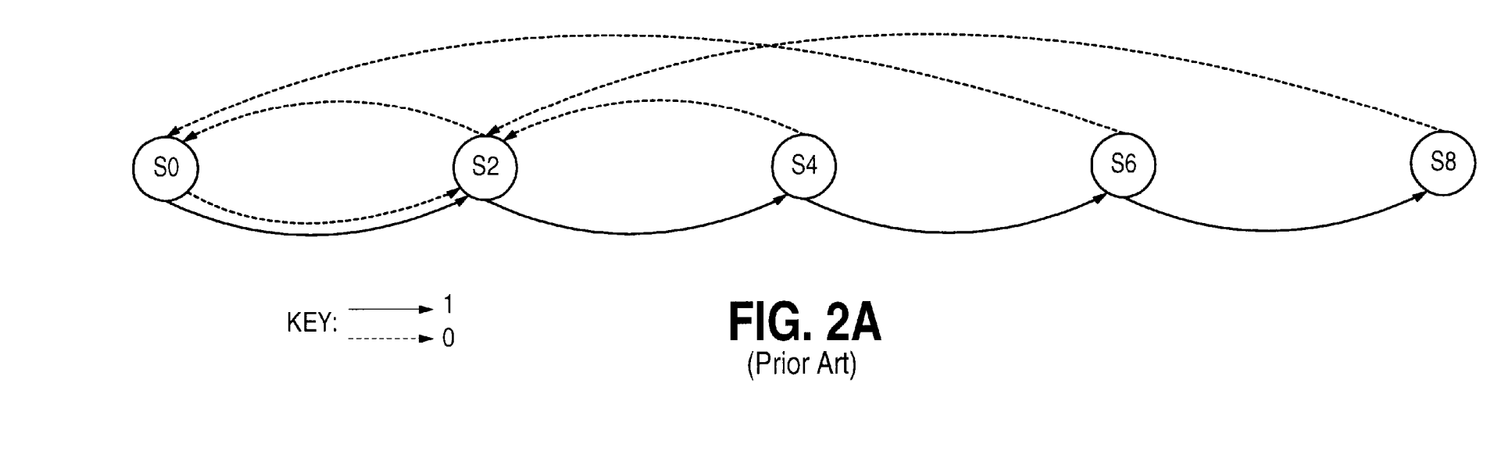
FIG. 2A is a state transition diagram defining a "Quadbit mod 2" channel code.
Figure 2B:
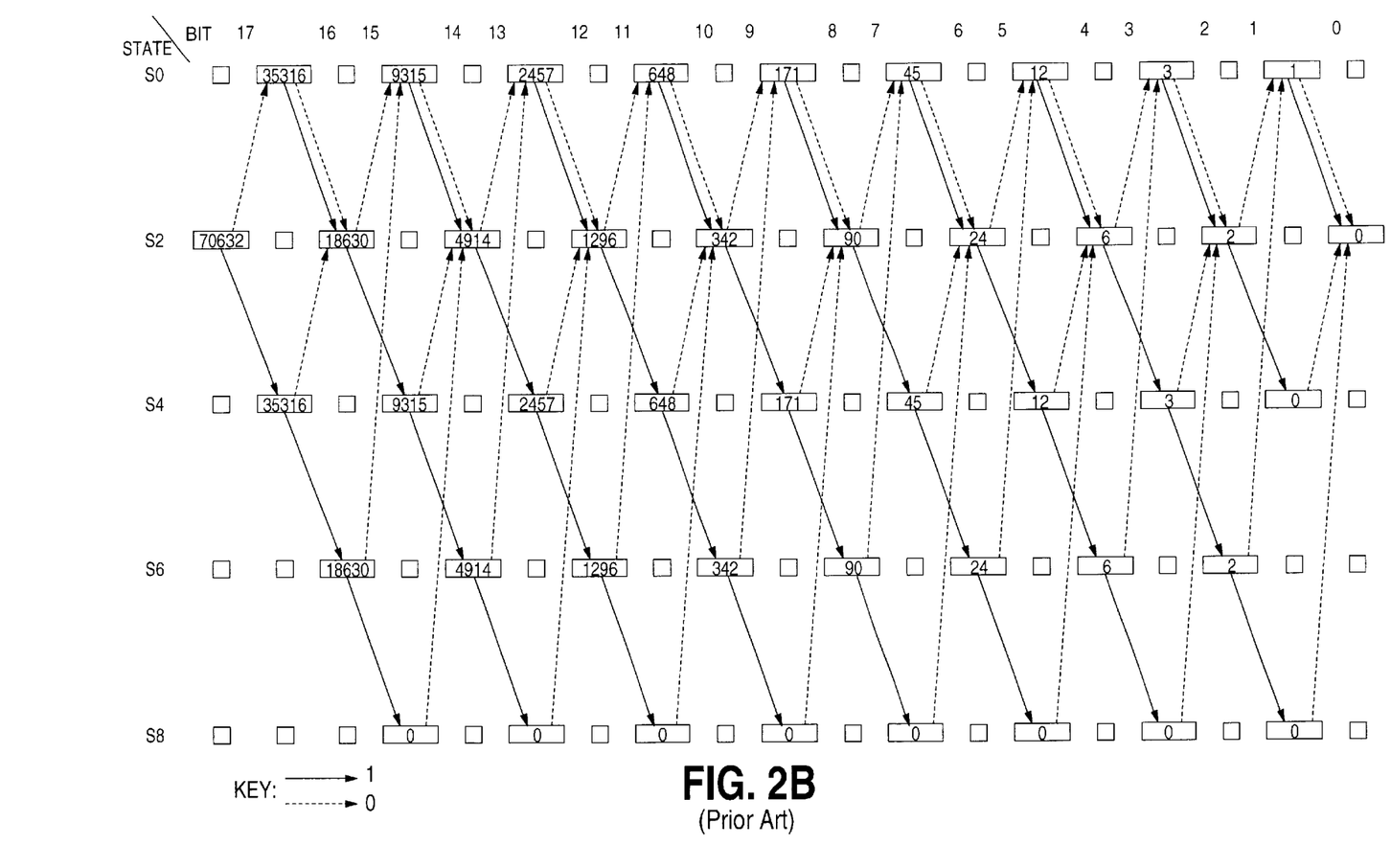
FIG. 2B is an enumerative trellis derived from the state transition diagram shown in FIG. 2A for implementing a rate 17/18 channel code.

As an example, consider the state transition diagram shown in FIG. 2A which implements a "Quadbit mod 2" constraint. The "Quadbit mod 2" constraint enhances the operation of a trellis sequence detector by allowing four consecutive medium transitions to occur only if started on every other sample interval, as well as coding out sequences comprising more than four consecutive medium transitions. From the state transition diagram shown in FIG. 2A an enumerative trellis can be constructed for a rate 17/18 channel code as shown in FIG. 2B. The 17/18 enumerative trellis has five states (S0 through S8) wherein state S2 has been selected as both the starting state and the ending state.

During the encoding process, at each state in the enumerative trellis an input value is compared to the state value and an output bit is generated (0 or 1) for the 18-bit output codeword, the bits for which are labeled along the top of the enumerative trellis in FIG. 2B. For example, if the input value is less than the state value a "0" bit is generated and the input value is not modified, otherwise a "1" bit is generated and the input value is updated by subtracting the state value. The selected branch leads to the next state, wherein another comparison is made and another output bit generated. This process continues until the last state of the enumerative trellis has been reached wherein all 18 bits of the output codeword will have been generated.

The encoding operation with respect to the enumerative trellis of FIG. 2B is further understood by considering the 17-bit input dataword (10000101110011010) which has an integer value of 68506. This is the initial input value compared with the starting state value of 70632 at S2; since 68506 is less than 70632, a "0" bit is generated for bit 18 by following the dashed-line branch to state S0 (the input value is not modified). Next, the input value of 68506 is compared to the current state value 35316 at S0; since 68506 is greater than 35316, a "1" bit is generated for bit 17 by following the solid-line branch to state S2, and the input value 68506 is modified by subtracting the state value 35316 to generate a next input value of 33190. The new input value 33190 is compared to the state value 18630 at S2; since 33190 is greater than 18630, a "1" bit is generated for bit 16 by following the solid-line branch to state S4, and the input value 33190 is modified by subtracting the state value 18630 to generate a next input value of 14560. This process continues until all 18 output bits have been generated and the last state in the enumerative trellis has been reached. For the representative 17-bit input dataword (10000101110011010) the 18-bit output codeword generated by the enumerative trellis of FIG. 2B is (011110000111100001).

Certain of the states in an enumerative trellis may have only one output branch in which case the encoder is forced to output a "0" or "1" bit. For example, state S8 in the trellis of FIG. 2B has only one output branch, a dashed-line branch for outputting a "0" bit. When this state is reached, the encoder is forced to output a "0" bit by following the dashed-line branch to state S2 and the input value is not modified.

When a codeword is received (read from the disk), it is decoded using the same enumerative trellis as that used for encoding. The decoding process is essentially the inverse of the encoding process; that is, an integer representing the decoded dataword is constructed by traversing the trellis in response to the bits in the received codeword starting with the same bit as with the encoding process (the most significant bit). The integer is initialized to zero, and then starting with the first state in the enumerative trellis, the state value is added to the integer if the received bit is a "1" bit, otherwise the integer is not modified. The branch corresponding to the received "0" or "1" bit is followed in the enumerative trellis to the next state wherein again the state value is added to the integer if the next bit of the received codeword is a "1" bit. This process continues until the last state of the enumerative trellis has been reached wherein the resultant integer represents the decoded block.

The decoding process is further understood by considering the how the enumerative trellis of FIG. 2B is used to decode the received codeword (011110000111100001) into an integer value of 68506. Since the first bit of the received codeword (the most significant bit) is a "0" bit, the state value 70632 for the starting state (state S2) is not added to the integer and the dashed-line branch is followed to the next state (state S0). Since the next bit of the received codeword is a "1" bit, the state value 35316 at S0 is added to the integer and the solid-line branch is followed to the next state (state S2). This process continues until the last state of the enumerative trellis has been reached wherein the integer will have a value of 68506.

In many communication systems, particularly disk storage systems, the throughput of the channel is of critical concern. Thus, in addition to the need for a cost-effective implementation for an enumerative ENDEC, there is a need for an enumerative ENDEC which exhibits high throughput so as not to slow the operation of the channel.

SUMMARY OF THE INVENTION

The present invention may be regarded as a cost-effective high-throughput enumerative encoder for encoding m-bit input datawords in an input data stream into n-bit output codewords in an encoded output data stream for use in a communication channel. The enumerative encoder comprises an input buffer for storing a plurality of bits in the input data stream, and a plurality of segmented compare tables for encoding the bits stored in the input buffer into the encoded output data stream, wherein each segmented compare table represents a segment of a full compare table of an enumerative trellis.

The present invention may also be regarded as a cost-effective high-throughput enumerative decoder for decoding n-bit input codewords in a received data stream into m-bit output datawords in a decoded data stream for use in a communication channel. The enumerative decoder comprises an input buffer for storing a plurality of bits in the received data stream, and a plurality of segmented compare tables for decoding the bits stored in the input buffer into the decoded data stream, wherein each segmented compare table represents a segment of a full compare table of an enumerative trellis.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF EMBODIMENTS

Enumerative Encoder—Full Compare Table

Figure 3:
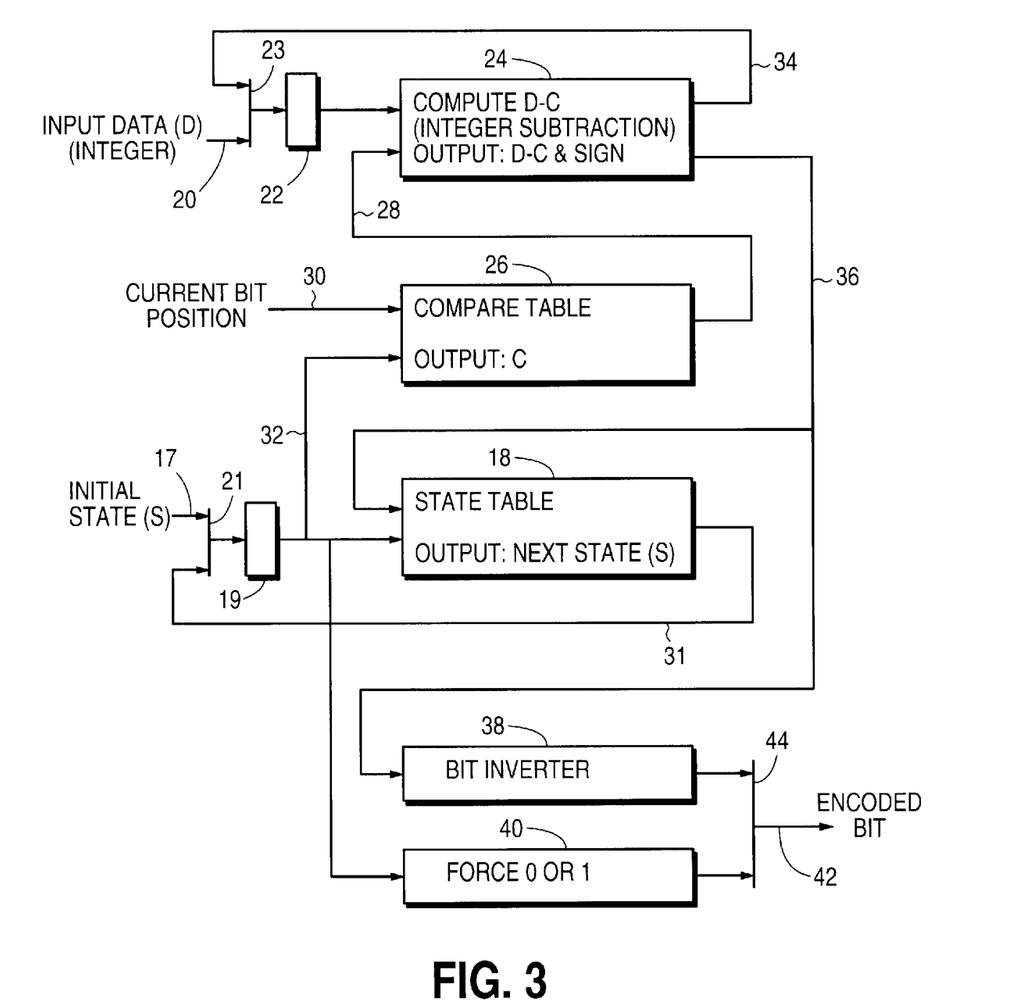
FIG. 3 shows an enumerative encoder implemented using a compare table representing a full enumerative trellis.

An overview of an enumerative encoder comprising a full compare table 26 of an enumerative trellis is shown in FIG. 3. To initialize the encoder, the input dataword 20 represented as an integer is loaded into register 22 through multiplexer 23, and an initial state 17 is loaded into register 19 through multiplexer 21. For example, in the enumerative trellis of FIG. 2B, the initial state is S2. The output of register 22 is input into a D-C computation block 24, and the output of register 19 (the current state 32) is input into a state table 18.

At each branch in the enumerative trellis, the D-C computation block 24 computes the value D-C where D is the input data and C is the current state value which is provided by a compare table 26 over line 28. The compare table 26 generates the current state value C based on the current bit position 30 of the input data and the current state 32 of the enumerative trellis (see the discussion above with respect to the enumerative trellis of FIG. 2B). The D-C computation block 24 outputs the subtraction value D-C 34 and a sign bit 36. The subtraction value D-C 34 is loaded back into register 22 through multiplexer 23 if the sign bit 36 is zero in order to update the input value D (i.e., if D is greater than C update the input value); otherwise, the input value D is unmodified.

The sign bit 36 is input into the state table 18 which responds by selecting the next state in the enumerative trellis. That is, if D-C is positive then the state table 18 selects the corresponding branch to the next state, otherwise the state table 18 selects the branch corresponding to a negative value. The selected state is output over line 31 and loaded into register 19 through multiplexer 21 so that it becomes the current state 32 for encoding the next input bit.

The sign bit 36 output by the D-C computation block 24 is inverted by inverter 38. If there is only one branch leaving the current state of the enumerative trellis, then a force circuit 40 forces the output bit 42 of the encoder to be a "0" or a "1"; otherwise the output of the inverter 38 is selected as the encoder output 42 through multiplexer 44.

Enumerative Decoder—Full Compare Table

Figure 4:
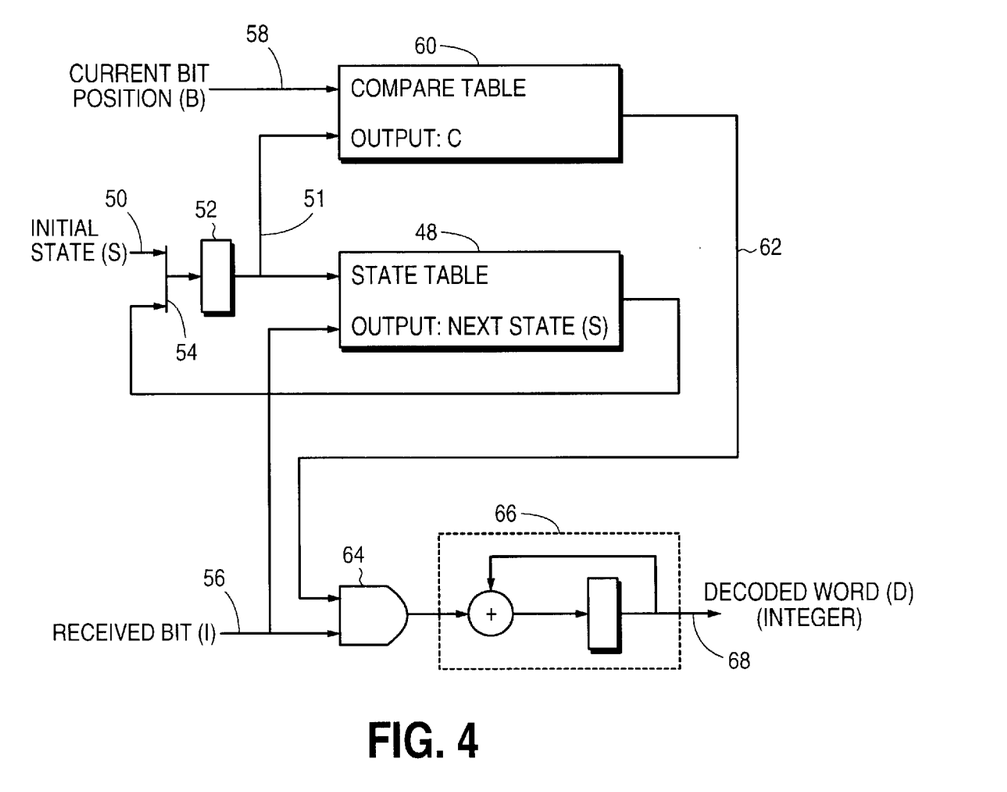
FIG. 4 shows an enumerative decoder implemented using a compare table representing a full enumerative trellis.

An overview of an enumerative decoder comprising a full compare table 60 of an enumerative trellis is shown in FIG. 4. To initialize the decoder, an initial state 50 is loaded into register 52 through multiplexer 54. For example, in the enumerative trellis of FIG. 2B, the initial state is S2. The output 51 of register 52, which represents the current state, is input into a state table 48. The state table 48 in the decoder of FIG. 4 is the same as the state table 18 in the encoder of FIG. 3; the difference being that the decoder uses the current state 51 to construct an integer output value (dataword) based on the input codeword 56.

As each bit of the input codeword 56 is processed, the compare table 60 outputs a current state value 62 based on the current state 51 and the current bit position 58 of the input codeword 56. For example, the compare table initially outputs a state value of 70,632 corresponding to the initial state S2 in the enumerative trellis of FIG. 2B. The state value 62 is applied to an AND gate 64; if the current bit of the input codeword 56 is a "1" bit, then the state value 62 is accumulated by accumulator 66, otherwise the state value 62 is ignored. The state table 48 updates the next state (via multiplexer 54 and register 52) based on the current input bit of the input codeword 56; that is, the branch corresponding to a "1" or "0" bit is selected. If there is only one branch leaving the current state, then the input bit of the input codeword 56 is ignored. Once the entire input codeword 56 has been processed, the entire enumerative trellis will have been traversed and the decoded dataword 68 is output by the accumulator 66.

Enumerative ENDEC—Segmented Compare Table

Encoding or decoding data on-the-fly at the channel rate using the enumerative ENDEC disclosed in FIG. 3 and FIG. 4 would require a k-bit subtraction (or addition) on every channel clock, where k is the number of bits in an input dataword. For example, a rate 64/65 enumerative ENDEC would require a 64-bit subtraction on every channel clock when encoding an input dataword. This is not practical for high speed communication channels, such as in disk storage systems.

One solution to this problem is to duplicate the ENDEC circuitry and process multiple codewords at a time. This reduces the clock rate of the ENDEC by CLK/n, where CLK is the channel clock and n is the number of duplicated ENDECs. However, duplicating the ENDEC circuitry is not cost effective, particularly when designing high rate codes.

Figure 5:
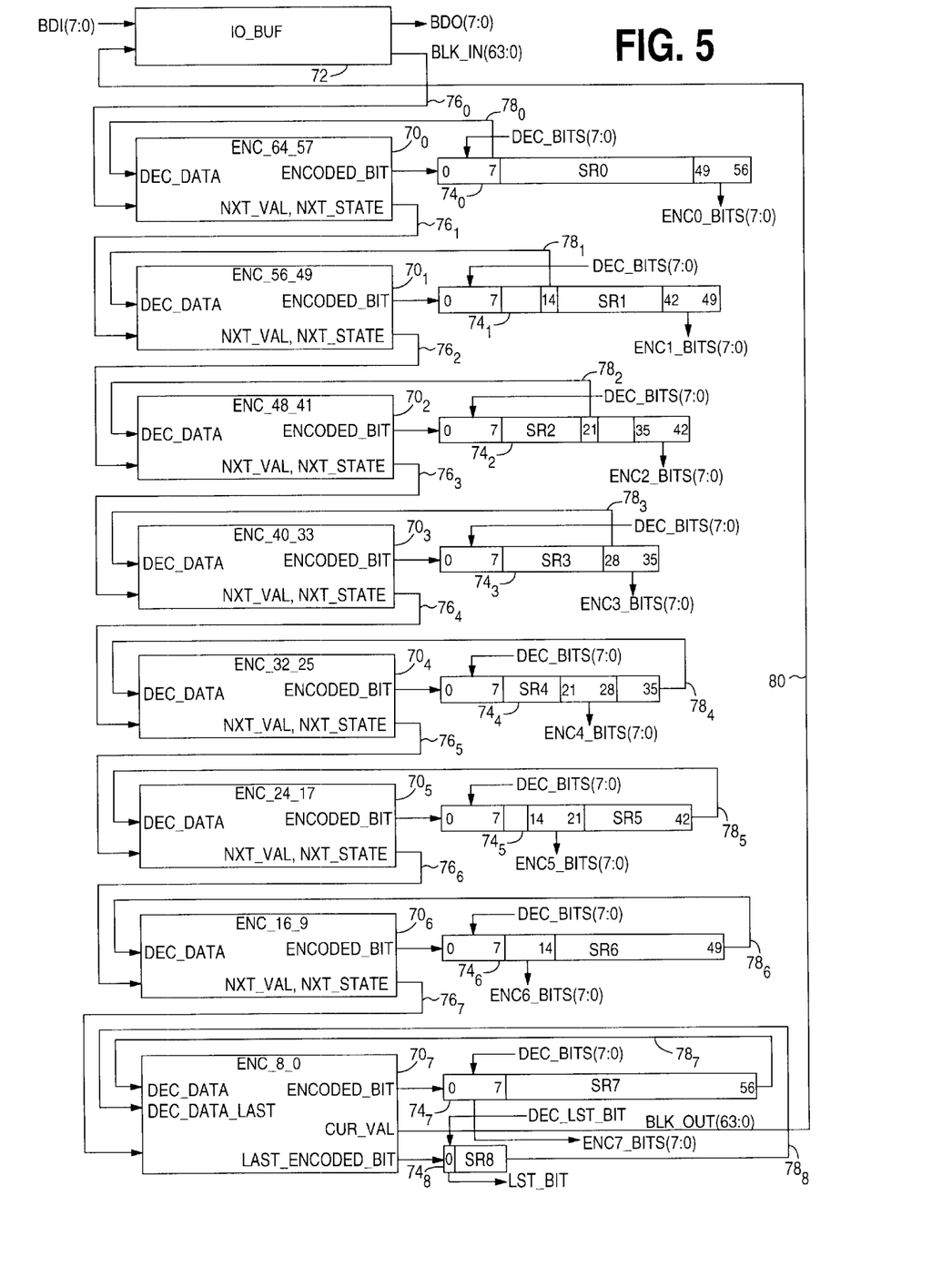
FIG. 5 shows an enumerative encoder/decoder (ENDEC) according to an embodiment of the present invention.

FIG. 5 shows an embodiment of the present invention which processes multiple codewords simultaneously without duplicating the ENDEC circuitry in its entirety. Instead, the full compare tables (26 and 60) of FIG. 3 and FIG. 4 are segmented into a plurality of segmented compare tables each of which represents a segment of the enumerative trellis and each of which operate on a corresponding segment of an input dataword during encoding and an input codeword during decoding. For example, the rate 16/17 enumerative trellis shown in FIG. 2B can be sliced vertically into segments and a corresponding compare table generated for each slice.

The example embodiment of FIG. 5 implements a rate 64/65 enumerative ENDEC where the full compare table representing the full enumerative trellis has been sliced into eight segmented compare tables. Each segmented compare table is part of a slice circuit $70_0$–$70_7$ where each slice circuit $70_0$–$70_7$ comprises the same circuitry shown in FIG. 3 and FIG. 4 with the full compare table (26 and 60) replaced by a segmented compare table.

During encoding, the first seven slice circuits $70_0$–$70_6$ generate 56 bits of an output codeword (8 bits each) and the last slice circuit $70_7$ generates the last 9 bits of an output codeword. During decoding, the first seven slice circuits $70_0$–$70_6$ process 56 bits of an input codeword (8 bits each) and the last slice circuit $70_7$ processes the last 9 bits of an input codeword. During both encoding and decoding, the eight slice circuits $70_0$–$70_7$ operate on eight codewords simultaneously as explained in further detail below with reference to FIGS. 6A–7B. Thus, the clock rate of the enumerative ENDEC can operate at ⅛ the rate of the channel clock.

The buffer IO_BUF 72 in FIG. 5 stores the incoming data bits during the encoding process and the outgoing data bits during the decoding process. During encoding, on each ENDEC clock the IO_BUF 72 receives one byte (8 bits) of input data, and during decoding it outputs one byte of decoded output. Because the code rate is 64/65, after receiving 64 bytes during the encoding process there will be an extra byte ready to output. Thus, the input to IO_BUF 72 must pause for one ENDEC clock to allow this byte to be output. Similarly, during the decoding process there is only 64 bytes output for every 65 bytes received; therefore, the decoding output will stop for one ENDEC clock after every 64th output byte.

A plurality of shift registers SR0–SR8 $74_0$–$74_8$ are provided for storing the bits of the encoded output codewords during the encoding process, and for storing the bits of the encoded input codewords during a decoding process. During the encoding process, the first eight registers $74_0$–$74_7$ output the first 64 bits of the encoded codeword (8 bits from each register), and the last register $74_8$ outputs the 65th bit of the encoded codeword. After an initial delay, the codeword data begins to be transferred from the shift registers SR0–SR8 $74_0$–$74_8$ to the channel. During each ENDEC clock, one byte of the encoded codewords is transferred from the appropriate shift register SR0–SR8 $74_0$–$74_8$ to the channel. During the decoding process, on each ENDEC clock a byte of an input codeword is loaded into the corresponding register $74_0$–$74_7$ and the 65th bit is loaded into register $74_8$. After an initial delay, the last slice circuit $70_7$ outputs a 64-bit decoded output dataword on every 8th ENDEC clock which is transmitted over line 80 and stored in IO_BUF 72.

The size of the shift registers $7_{40}$–$7_{48}$ varies for each slice circuit $70_0$–$70_7$ and the amount of memory used in each register $74_0$–$74_8$ varies depending on whether the ENDEC is encoding or decoding. During encoding, the entire storage area is utilized in the first four registers $74_0$–$74_3$ and a decreasing amount of storage area is used in the next four registers $74_4$–$74_7$. During decoding, the situation is reversed as illustrated in FIG. 5. The size of the shift registers $7_{40}$–$7_{48}$ varies due to the overlapping method in which the codewords are encoded and decoded as will now be described.

During the encoding process, the IO_BUF 72 first receives eight bytes of input data during the first eight ENDEC clocks to form a 64-bit input dataword. The 64-bit input dataword is then transferred to the first slice circuit $70_0$ over line $76_0$. During the next eight ENDEC clocks, the first slice circuit $70_0$ computes bits 64–57 of the output codeword which are shifted serially into shift register SR0 $74_0$. Concurrently, the next eight input data bytes are input into IO_BUF 72 such that the next 64-bit input dataword is ready to be processed. On the next clock cycle, the first slice circuit $70_0$ transfers a next value NXT_VAL and a next state NXT_STATE to the second slice $70_1$ over line $76_1$. The NXT_VAL represents the current state value input into the D-C computation block (conceptually, the value stored in register 22 of FIG. 3). The NXT_STATE represents the current state in the enumerative trellis after processing the first eight bits (conceptually, the value stored in register 19 of FIG. 3). Concurrently, the next 64-bit input dataword is transferred from the IO_BUF 72 to the first slice circuit $70_0$ over line $76_0$. During the next eight ENDEC clock cycles, the following operations are performed concurrently:

1. the next eight input data bytes are input into IO_BUF 72 such that the next 64-bit input dataword is ready to be processed;
2. the first slice circuit $70_0$ computes bits 64–57 of the next output codeword which are shifted serially into shift register SR0 $74_0$; and
3. the second slice circuit $70_1$ computes bits 56–49 of the first output codeword which are shifted serially into shift register SR1 $74_1$.

On the eighth ENDEC clock, the NXT_VAL and NXT_STATE values are shifted from the current slice circuits $70_0$–$70_6$ to the following slice circuits $70_1$–$70_7$ and the above process is reiterated. This process continues for 64 ENDEC clocks during which time the output registers SR0–SR8 $74_0$–$74_8$ receive the entire 65-bit output codeword for the first codeword, as well as portions of the following codewords. Note that on the 64th ENDEC clock, the last two bits (bits 0 and 1) of the 65-bit output codeword are generated. After 57 bits have been shifted into SR0 $74_0$, outputting to the channel begins. At this point, the first byte of the first codeword is stored in SR0(49:56), the second byte is stored in SR1(41:48), the seventh byte is stored in SR6(1:8), and the first bit of the last byte is stored in SR7(0). Registers SR0–SR8 $74_0$–$74_8$ continue to shift during outputting to the channel so that the output from SR1 $74_1$ is read from SR1(42:49) since it is read one ENDEC clock after the byte from SR0 $74_0$ is read. The output from SR6 $74_6$ is read from SR6(7:14) since it is taken six ENDEC clocks after SR0 $74_0$ is read. As explained above, on every 64th ENDEC clock the input into IO_BUF 72 is paused for one ENDEC clock to allow the extra encoded byte to be transferred from the shift registers SR0–SR8 $74_0$–$74_8$ to the channel.

Figure 6A:
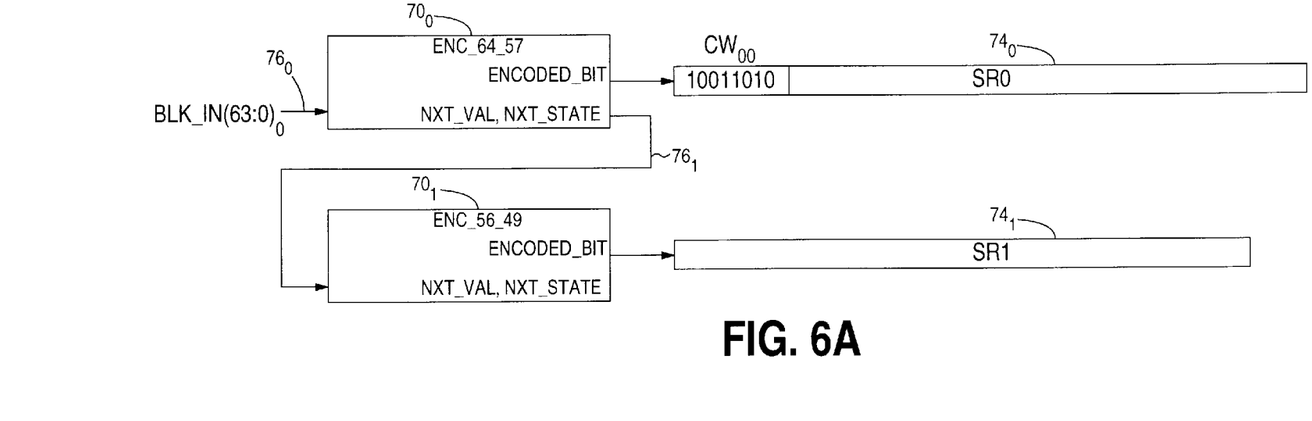
FIGS. 6A and 6B illustrate the encoding operation of the enumerative ENDEC of FIG. 5.
Figure 6B:
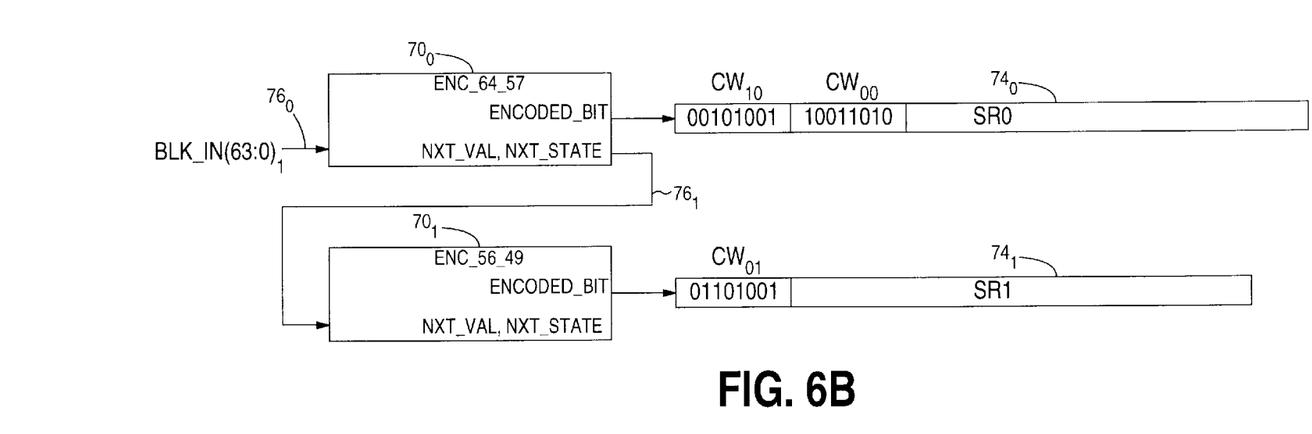

The encoding process is further understood with reference to FIG. 6A and 6B which illustrate the encoding operation for two consecutive input datawords. In FIG. 6A, the first input dataword has been processed by the first slice circuit $70_0$ for eight ENDEC clocks to generate the first byte of the first output codeword (denoted $CW_{00}$) which has been shifted into shift register SR0 $74_0$. On the eighth ENDEC clock, the NXT_VAL and NXT_STATE values are transferred to the second slice circuit $70_1$ concurrent with the next input dataword being loaded into the first slice circuit $70_0$. As illustrated in FIG. 6B, during the next eight ENDEC clocks the first slice circuit $70_0$ computes the first byte of the next output codeword (denoted $CW_{10}$) which is shifted into shift register SR0 $74_0$ concurrent with the second slice circuit $70_1$ computing the second byte of the first output codeword (denoted $CW_{01}$) which is shifted into shift register SR1 $74_1$. The slice circuits $70_0$–$70_6$ then transfer the NXT_VAL and NXT_STATE values to the following slice circuits $70_1$–$70_7$ and the process continues.

During the decoding. process, the data bits received from the channel are stored in the shift registers SR0(0:7)–SR7(0:7) starting with SR0(0:7). When SR7(0:7) is written, the 65th bit is loaded into SR8(0). The first byte of a received codeword is stored in SR0(0:7) on the first ENDEC clock, the next byte is stored in SR1(0:7) on the next ENDEC clock, and so on. After the first byte of a received codeword is loaded into register SR0(0:7) then during the next eight ENDEC clock cycles the bits are shifted serially over line $78_0$ from SR0(7) into the first slice circuit $70_0$ for decoding (concurrent with loading shift registers SR1(0:7)–SR7(0:7) $74_1$–$74_7$ and SR8(0) $74_8$ with the subsequent bytes of the received codeword). On the eighth ENDEC clock, the result of decoding the first byte of the received codeword (the accumulated value NXT_VAL and the ending state NXT_STATE) are transferred to the next slice circuit $70_1$ over line $76_1$. Conceptually, the NXT_VAL corresponds to the value accumulated in accumulator 66 of FIG. 4, and the NXT_STATE corresponds to the value stored in register 52 of FIG. 4. During the next eight ENDEC clock cycles, the following operations are performed concurrently:

1. the next eight bytes for the next received codeword are input into the shift registers SR0(0:7)–SR8(0:7) $74_0$–$74_8$;
2. the first slice circuit $70_0$ decodes the first byte of the next codeword; and
3. the second slice circuit $70_1$ decodes the second byte of the first received codeword using the NXT_VAL and NXT_STATE values computed by the first slice circuit $70_0$ for the first byte and transferred over line $76_1$.

On the next ENDEC clock, the NXT_VAL and NXT_STATE values are shifted from the current slice circuits $70_0$–$70_6$ to the following slice circuits $70_1$–$70_7$ and the above process is reiterated. This process continues for 64 ENDEC clocks after which the last slice circuit $70_7$ contains the accumulated value for the integer representing the first decoded dataword; this value CUR_VAL is transferred over line 80 to the I0_BUF 72. On every 8th ENDEC clock thereafter, the last slice circuit $70_7$ outputs the integer value CUR_VAL for a next decoded dataword.

Figure 7A:
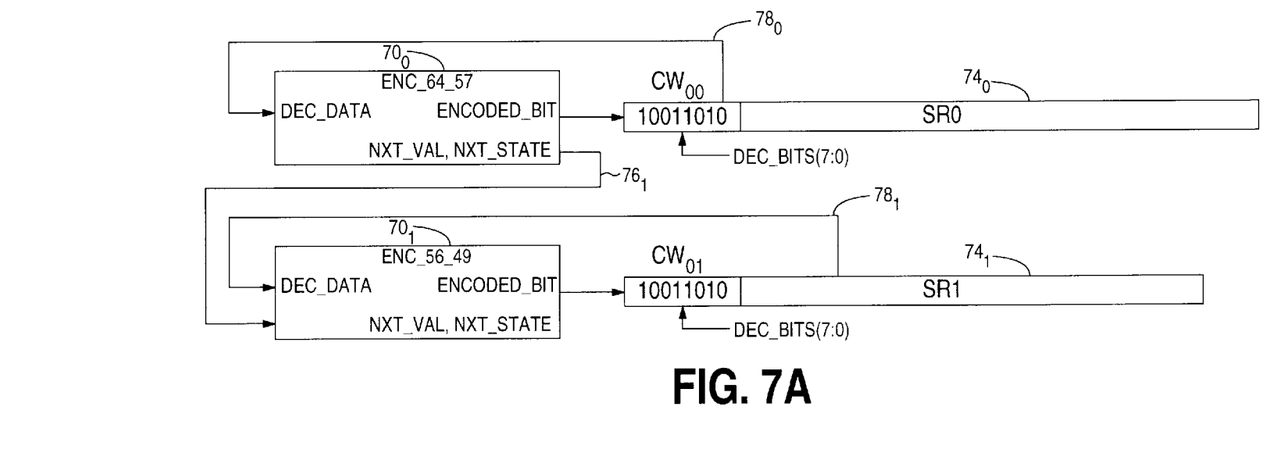
FIGS. 7A and 7B illustrate the decoding operation of the enumerative ENDEC of FIG. 5.
Figure 7B:
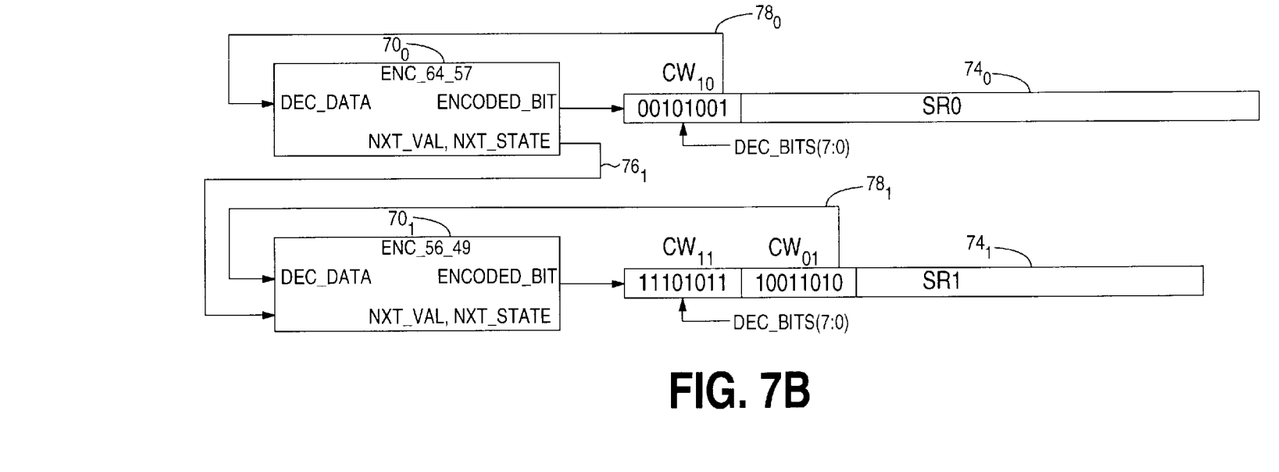

The decoding process is further understood with reference to FIG. 7A and 7B which illustrate the decoding operation for two consecutive received codewords. In FIG. 7A, the first byte of a received codeword (denoted $CW_{00}$) has been stored in register SR0(0:7) $74_0$ on the first ENDEC clock and the second byte (denoted $CW_{01}$) has been stored in register SR1(0:7) $74_1$ on the second ENDEC clock. Also on the second ENDEC clock, the first slice circuit $70_0$ processes the first bit of the first byte $CW_{00}$ from SR0(7) to begin the decoding process. As shown in FIG. 7B, after eight ENDEC clocks the first slice circuit $70_0$ has finished decoding the first byte $CW_{00}$ of the received codeword and transfers over line 76, the NXT_VAL and the NXT_STATE values to the next slice circuit $70_1$. Concurrently, the first byte of the next codeword (denoted $CW_{10}$) is loaded into register SR0(0:7) $74_0$. On the next ENDEC clock the second byte of the next codeword (denoted $CW_{11}$) is loaded into register SR1(0:7) $74_1$ and the second slice circuit $70_1$ processes the first bit of the second byte $CW_{01}$ in the first codeword from SR1(14). After eight ENDEC clocks the slice circuits $70_0$–$70_6$ transfer the NXT_VAL and NXT_STATE values to the following slice circuits $70_1$–$70_7$ and the process continues.

The following is a glossary of terms used in FIG. 5:

BDI(7:0)—Incoming data from the buffer encoding. This data is byte transferred to IO_BUF 72 to construct the 64-bit input codewords.

BLK_IN(63:0)—A 64-bit input dataword transferred from IO_BUF 72 to the first slice circuit $70_0$ during the encoding operation.

SR0–SR7—The shift registers $74_0$–$74_7$ of varying length (SR0=57 bits; SR1=50 bits; SR2=43 bits; SR3=36 bits; SR4=36 bits; SR5=43 bits; SR6=50 bits; SR7=57 bits). Each shift register has a parallel load into bits (0:7) for inputting data for decoding, and an 8-bit parallel output from varying points within the registers for offloading the encoded data at the appropriate time.

SR8—The 8-bit shift register $74_8$ which accumulates the 65th bit during the encoding operation, and which stores the 65th bit during the decoding operation.

DEC_BITS(7:0)—Data bytes received from the channel during a read operation which are stored in the shift registers SR0–SR7(0:7) $74_0$–$74_7$.

DEC_LST_BIT—The 65th bit of a received codeword during decoding which is stored in shift register SR8(0) $74_8$.

ENC*_BITS(7:0)—The encoded data bytes transferred from the shift registers SR0–SR7 $74_0$–$74_7$ to the channel during a write operation.

BLK_OUT(63:0)—A 64-bit decoded dataword output by the last slice circuit $70_7$ during the decoding operation.

BDO(7:0)—The decoded data output from IO_BUF 72 a byte at a time.

ENC_8_0 through ENC_64_57—The eight slice circuits $70_0$–$70_7$ where the numerals refer to the bit positions of an input dataword encoded by each slice.

Rate 64/65 State Transition Table

Figure 8:
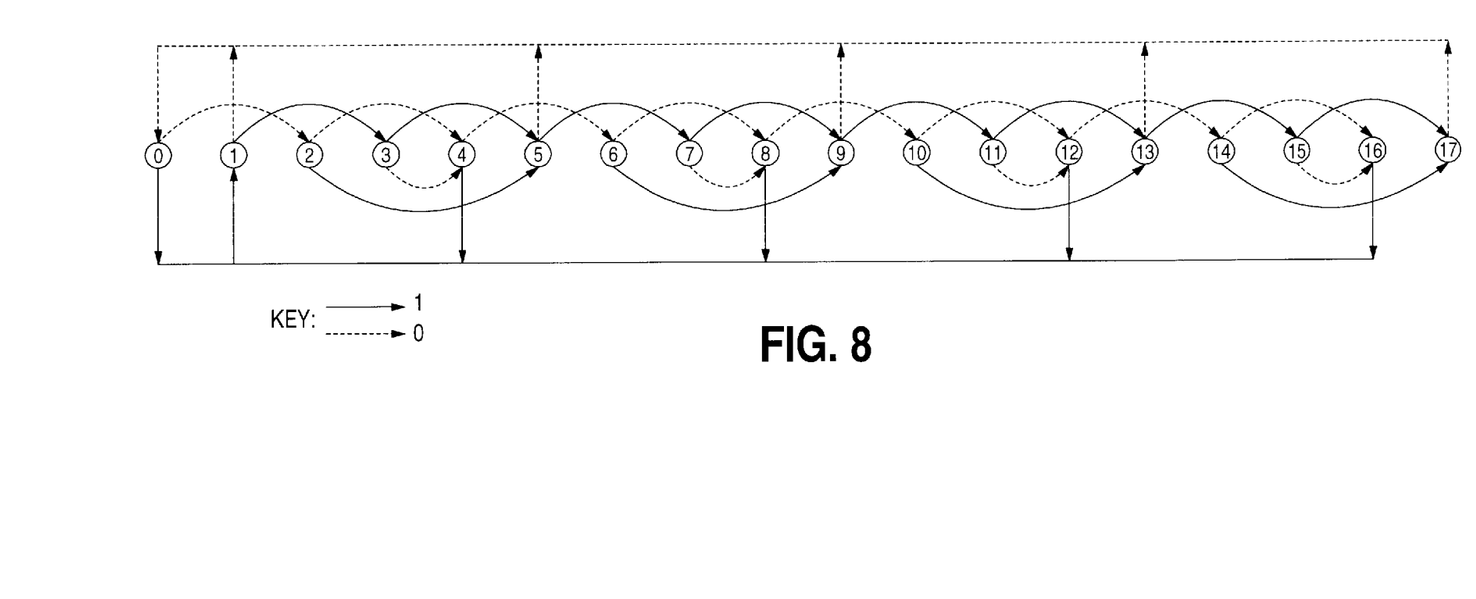
FIG. 8 is a state transition diagram for a rate 64/65 channel code implemented by the enumerative ENDEC of FIG. 5.

A state transition diagram for a rate 64/65 code is shown in FIG. 8. A corresponding enumerative trellis can be constructed from this state transition diagram using well known techniques. The segmented compare tables in the slice circuits $70_0$–$70_7$ of FIG. 5 are then constructed by slicing the enumerative trellis into eight segments. A complete implementation of a rate 64/65 enumerative ENDEC according to an embodiment of the present invention, including detailed circuit diagrams and VHDL code, is disclosed in the microfiche appendix.

Rate n/(n+1) Enumerative ENDEC

The example embodiment of the enumerative ENDEC illustrated in FIG. 5 implements a rate 64/65 code. However, the circuitry can be modified to accommodate any code rate and the enumerative trellis can be segmented arbitrarily rather than on byte boundaries. Furthermore, the circuitry of FIG. 5 could be modified to shorten the code rate on-the-fly to accommodate different code rates by bypassing a selected number of the encoding/decoding sections. For the implementation shown in FIG. 5, it is convenient to shorten the code rate by a multiple of 8. For example, to shorten the ENDEC to a code rate of 56/57, the input data to be encoded and the received data to be decoded would be sent directly to the slice circuit ENC_56_49 $70_1$. Alternatively, the input data and received data could be sent directly to the slice circuit ENC_8_0 $70_7$ which would implement a rate 8/9 code.

Shortening the code rate so as to provide a rate n/(n+1) enumerative ENDEC facilitates a channel employing a commuted read/write channel wherein the error correction code (ECC) is the outer code and the channel code is the inner code. The above-referenced copending patent application entitled "MULTIPLE-RATE CHANNEL ENDEC IN A COMMUTED READ/WRITE CHANNEL FOR DISK STORAGE SYSTEMS" discloses a commuted read/write channel which preferably employs a rate n/(n+1) enumerative ENDEC according to the aspects of the present invention.

The objects of the invention have been fully realized through the embodiments disclosed herein. Those skilled in the art will appreciate that the various aspects of the invention can be achieved through different embodiments without departing from the essential function. For example, the enumerative trellis could be segmented on arbitrary selected boundaries. Further, the circuitry shown in FIG. 5 could be reduced or extended to accommodate various code rates and various codeword sizes. The disclosed embodiments are thus illustrative and not intended to limit the scope of the present invention as appropriately construed from the following claims.

We claim:

1. A cost-effective high-throughput enumerative encoder for encoding m-bit input datawords in an input data stream into n-bit output codewords in an encoded output data stream for use in a communication channel, the enumerative encoder comprising:

(a) an input buffer for storing a plurality of bits in the input data stream; and (b) a plurality of segmented compare tables for encoding the bits stored in the input buffer into the encoded output data stream, wherein each segmented compare table represents a segment of a full compare table of an enumerative trellis.

2. The enumerative encoder as recited in claim 1, wherein each segmented compare table encodes a multi-bit input value derived from an m-bit input dataword into a segment of an n-bit output codeword.

3. The enumerative encoder as recited in claim 2, wherein each of the segmented compare tables comprises a comparator for comparing the multi-bit input value to a state value in the enumerative trellis.

4. The enumerative encoder as recited in claim 2, wherein:

(a) each segment of the n-bit output codeword is stored in a corresponding output register; and (b) at least one of the output registers is used as an input register for storing a received data stream during a decoding operation.

5. The enumerative encoder as recited in claim 1, wherein the segmented compare tables are used to decode a received data stream during a decoding operation.

6. The enumerative encoder as recited in claim 1, wherein:

(a) the segmented compare tables are connected in series; and (b) each compare table outputs a next input data value and a next state value for input into the following segmented compare table.

7. The enumerative encoder as recited in claim 1, wherein a first segmented compare table operates on a first segment of a first m-bit input dataword to generate a first segment of a first n-bit output codeword, and concurrently a second segmented compare table operates on a second segment of a second m-bit input dataword to generate a second segment of a second n-bit output codeword.

8. The enumerative encoder as recited in claim 1, wherein:
(a) the communication channel is a disk storage system; and
(b) the plurality of segmented compare tables encode a run length constraint in the output data stream.

9. A cost-effective high-throughput enumerative decoder for decoding n-bit input codewords in a received data stream into m-bit output datawords in a decoded data stream for use in a communication channel, the enumerative decoder comprising:
(a) an input buffer for storing a plurality of bits in the received data stream; and
(b) a plurality of segmented compare tables for decoding the bits stored in the input buffer into the decoded data stream, wherein each segmented compare table represents a segment of a full compare table of an enumerative trellis.

10. The enumerative decoder as recited in claim 9, wherein each segmented compare table decodes a segment of an n-bit input codeword into a multi-bit output value.

11. The enumerative decoder as recited in claim 10, wherein:
(a) each of the segmented compare tables comprises an accumulator for accumulating a state value in the enumerative trellis based on a current state and a bit in the segment of the n-bit input codeword; and
(b) the accumulator outputs the multi-bit output value.

12. The enumerative decoder as recited in claim 10, wherein:
(a) the input buffer comprises an input register for each of the segmented compare tables for storing the segment of the n-bit input codeword; and
(b) at least one of the input registers is used as an output register for storing an encoded data stream during an encoding operation.

13. The enumerative decoder as recited in claim 9, wherein the segmented compare tables are used to encode an input data stream during an encoding operation.

14. The enumerative decoder as recited in claim 9, wherein:
(a) the segmented compare tables are connected in series; and
(b) each compare table outputs an output value and a next state value for input into the following segmented compare table.

15. The enumerative decoder as recited in claim 9, wherein a first segmented compare table operates on a first segment of a first n-bit input codeword to generate a first output value corresponding to a first m-bit output dataword, and concurrently a second segmented compare table operates on a second segment of a second n-bit input codeword to generate a second output value corresponding to a second m-bit output dataword.

16. The enumerative decoder as recited in claim 9, wherein:
(a) the communication channel is a disk storage system; and
(b) the plurality of segmented compare tables decode a run length constraint in the output data stream.

17. A cost-effective high-throughput enumerative encoder/decoder (ENDEC) for encoding m-bit input datawords in an input data stream into n-bit output codewords in an encoded output data stream, and for decoding n-bit input codewords in a received data stream into m-bit output datawords in a decoded data stream, the enumerative ENDEC comprising:
(a) an input buffer for storing a plurality of input bits in the input data stream, and for storing a plurality of received bits in the received data stream; and
(b) a plurality of segmented compare tables for encoding the input bits stored in the input buffer into the encoded output data stream, and for decoding the received bits stored in the input buffer into the decoded data stream, wherein each segmented compare table represents a segment of a full compare table of an enumerative trellis.

18. The enumerative ENDEC as recited in claim 17, wherein each segmented compare table encodes a multi-bit input value derived from an m-bit input dataword into a segment of an n-bit output codeword.

19. The enumerative ENDEC as recited in claim 18, wherein each of the segmented compare tables comprises a comparator for comparing the multi-bit input value to a state value in the enumerative trellis.

20. The enumerative ENDEC as recited in claim 18, wherein:
(a) each segment of the n-bit output codeword is stored in a corresponding output register; and
(b) at least one of the output registers is used as an input register for storing a received data stream during a decoding operation.

21. The enumerative ENDEC as recited in claim 17, wherein:
(a) the segmented compare tables are connected in series; and
(b) each compare table outputs a next input data value and a next state value for input into the following segmented compare table.

22. The enumerative ENDEC as recited in claim 17, wherein a first segmented compare table operates on a first segment of a first m-bit input dataword to generate a first segment of a first n-bit output codeword, and concurrently a second segmented compare table operates on a second segment of a second m-bit input dataword to generate a second segment of a second n-bit output codeword.

23. The enumerative ENDEC as recited in claim 17, wherein:
(a) the communication channel is a disk storage system; and
(b) the plurality of segmented compare tables encode a run length constraint in the output data stream.

24. The enumerative ENDEC as recited in claim 17, wherein each segmented compare table decodes a segment of an n-bit input codeword into a multi-bit output value.

25. The enumerative ENDEC as recited in claim 24, wherein:
(a) each of the segmented compare tables comprises an accumulator for accumulating a state value in the enumerative trellis based on a current state and a bit in the segment of the n-bit input codeword; and
(b) the accumulator outputs the multi-bit output value.

26. The enumerative ENDEC as recited in claim 24, wherein:
(a) the input buffer comprises an input register for each of the segmented compare tables for storing the segment of the n-bit input codeword; and (b) at least one of the input registers is used as an output register for storing an encoded data stream during an encoding operation.

27. The enumerative ENDEC as recited in claim 17, wherein:
(a) the segmented compare tables are connected in series; and
(b) each compare table outputs an output value and a next state value for input into the following segmented compare table.

28. The enumerative ENDEC as recited in claim 17, wherein a first segmented compare table operates on a first segment of a first n-bit input codeword to generate a first output value corresponding to a first m-bit output dataword, and concurrently a second segmented compare table operates on a second segment of a second n-bit input codeword to generate a second output value corresponding to a second m-bit output dataword.

29. The enumerative ENDEC as recited in claim 17, wherein:
(a) the communication channel is a disk storage system; and
(b) the plurality of segmented compare tables encode a run length constraint in the output data stream.

* * * * *